United States Patent
Paumier et al.

(10) Patent No.: US 7,810,015 B2
(45) Date of Patent: Oct. 5, 2010

(54) DECODING WITH A CONCATENATED ERROR CORRECTING CODE

(75) Inventors: Laurent Paumier, Grenoble (FR); Pascal Urard, Theys (FR)

(73) Assignee: STMicroelectronics SA, Montrouge (FR)

( * ) Notice: Subject to any disclaimer, the term of this patent is extended or adjusted under 35 U.S.C. 154(b) by 947 days.

(21) Appl. No.: 11/563,595

(22) Filed: Nov. 27, 2006

(65) Prior Publication Data

US 2007/0198896 A1   Aug. 23, 2007

(30) Foreign Application Priority Data

Nov. 28, 2005   (FR) .................................. 05 12022

(51) Int. Cl.
*G11C 29/00* (2006.01)

(52) U.S. Cl. .................. 714/767; 714/746; 714/805

(58) Field of Classification Search ............... 714/767, 714/746, 763, 800, 805, 752, 758, 782, 784
See application file for complete search history.

(56) References Cited

U.S. PATENT DOCUMENTS 6,047,112 A * 4/2000 Wise et al. ................. 714/1
6,381,728 B1 * 4/2002 Kang ...................... 714/781

FOREIGN PATENT DOCUMENTS

EP        1528687 A1    5/2005

OTHER PUBLICATIONS

Chen, Y. et al., "Area Efficient Parallel Decoder Architecture for Long BCH Codes," Acoustics, Speech, and Signal Processing, IEEE International Conference, Montreal, Canada, May 17-21, 2004, pp. 73-76.
Matsushima, T.K. et al., "Parallel Encoder and Decoder Architecture for Cyclic Codes," IEICE Transactions on Fundamentals of Electronics, Communications and Computer Sciences, vol. 79, No. 9, Sep. 1996, pp. 1313-1323.
Urard, P. et al., A 135Mbps DVB-S2 Compliant Codec Based on 64800-bit LDPC and BCH Codes (ISSCC Paper 24.3), Design Automation Conference, Anaheim, California, Jun. 13-17, 2005, pp. 547-548.
Valenti, M.C. et al., "Digital Video Broadcasting," http://www.csee.wvu.edu/{mvalenti/documents.DVBChapter.pdf, Oct. 27, 2004, pp. 1-19.

* cited by examiner

*Primary Examiner*—Fritz Alphonse
(74) *Attorney, Agent, or Firm*—Lisa K. Jorgenson; Robert Iannucci; Seed IP Law Group PLLC

(57) ABSTRACT

A concatenated channel decoding method wherein the bits of a set of N1 bits decoded using a first iterative block decoding algorithm and intended to be decoded using a second block decoding algorithm, are sent in parallel in at least one subset of P bits to a buffer for temporary storage. The decoding method comprises receiving in parallel at least one subset of Q bits belonging to the set of N1 bits sent to the buffer, detecting errors with the help of the second decoding algorithm, based on the bits decoded using the first decoding algorithm, and correcting the bits stored in the buffer as a function of possible errors detected. Detecting errors and/or the correcting the stored bits comprise a parallel processing of the bits of each subset of Q bits received.

15 Claims, 8 Drawing Sheets

DECODING WITH A CONCATENATED ERROR CORRECTING CODE

BACKGROUND OF THE INVENTION

1. Field of the Invention

The methods, devices, and systems described herein generally relate to channel decoding.

2. Description of the Related Art

Channel coding or forward error correction coding (FEC) consists of adding redundancy to information data to be sent over a noisy channel or stored on a medium which is likely to be damaged, such as a CD-ROM. Whether receiving or reading, redundant data can allow recovering the information data.

With reference to FIG. 1, a typical generic transmission subsystem contains, on the side of the transmitter 10, a data source 11 (DAT_SRC), followed by a source encoder 12 (SCR_ENC), a channel encoder 13 (CH_ENC), and a modulator 14 (MOD). The source encoder 12 compresses the information data (for example, using a standard such as MPEG, H264, etc.) so as to reduce the amount of data to be transmitted. The channel encoder 13 adds redundancy to enable the receiver 30 to correct potential errors due to the noise N introduced into the transmission channel 20. The modulator 14 adapts the signal to the transmission channel (for example, satellite transmission channel, radio transmission channel, etc.). On the receiver side 30, a demodulator 34 (DEMOD) followed by a channel decoder 33 (CH_DEC) and a source decoder 32 (SRC_DEC), perform operations inverse to those performed by the modulator 14, the channel encoder 13, and the source encoder 12, respectively. The demodulated and decoded data are then restored to the entity that uses the data 31 (DAT_U).

Block codes, among the current most common error correcting codes, consist of adding to each message of K information bits a given number (N-K) of redundancy bits, so as to form codewords of N bits.

Examples of block-based channel coding algorithms include the BCH (Bose-Chaudhuri-Hocquenghem) code, the Reed-Solomon codes, the Hamming code, and the LDPC (Low Density Parity Check) codes.

BCH and Reed-Solomon error correcting codes are part of a class of codes which are described through the roots of a polynomial with coefficients in a finite field called the Galois field.

With such codes, data are received at a receiver, with these data corresponding to the codewords sent over a channel. For a bit d of a sent codeword which has a corresponding received signal y, a decision is made, after steps of demodulation and synchronization, to associate a binary value to this signal y. Because of noise in the channel, the bit value associated with a signal y may be erroneous.

The error detection means enable detecting errors from the received bit values. The error detection means may comprise syndrome calculation means, error locator polynomial coefficient determination means, and error position locator means.

A number 2t of syndrome components are calculated from the bit values received, with t corresponding to the maximum number of errors which may be corrected per block. If all the components are zero, this means the transmission was performed without errors or that the addition of channel noise to the transmitted codeword has produced a new codeword.

Otherwise, the calculated components are processed to locate the positions of errors via an error locator polynomial. The positions of erroneous bits are obtained by determining the roots of the error locator polynomial.

FIG. 2 schematically shows an example of a device for decoding data corresponding to codewords obtained by prior art BCH coding.

The bit values are received one by one by the syndrome calculation means 21. The component values thus calculated are sent to the error locator polynomial coefficient determination means 22 based on the syndrome components. The coefficients are then sent to the error locator means 23 based on the error locator polynomial.

In the case of decoding with a Reed-Solomon algorithm, an additional step using the Forney algorithm may be applied prior to the correction step.

The correction means, for example an adder 25, enable modifying the received bit values corresponding to the positions of the located errors. The error position locator means 23 can send a vector of K serial bits to the adder. The bits of this vector are zero except for the bits situated at the positions of the located errors.

The received bits are temporarily stored in a buffer 24, for example a FIFO (First In First Out) buffer. The received bits remain in the FIFO buffer for the time necessary to calculate the syndrome and determine the error positions.

LDPC codes are a class of error correcting codes invented in 1960 by Robert Gallager, which constitute an alternative to the Viterbi codes as well as to the more recent turbo codes. The first commercial standard stipulating the use of an LDPC code is the DVB-S2 standard, which is the second-generation ETSI (European Telecommunication Standardization Institute) standard for satellite digital video broadcasting. The DVB-S2 standard, published by ETSI, is incorporated herein in its entirety.

An LDPC encoder adds N-K redundancy bits to a message of K bits, which enable correcting transmission errors on the receiver side. These N-K bits are called parity bits.

The N-K bits added to each message of K information bits are calculated using an H matrix called the parity check matrix. This H matrix has N-K rows and N columns. It contains "0" and "1" values, with the latter in low proportions, which is why codes based on such a parity matrix are called low density parity check codes. The H matrix may, for example, contain 48600 rows and 64800 columns, meaning K=16200 and N=64800.

On the receiver side, the LDPC decoder corrects erroneous bits based on the blocks received through the transmission channel. Each block corresponds to a codeword sent over the transmission channel. For each bit sent there is a corresponding log-likehood ratio (LLR). Each LLR is coded in a number m of bits, for example 6 bits.

A block therefore comprises N*m bits, for example 64800*6 bits.

For a bit d which has a corresponding signal y received by the LDPC decoder after noise is added to the transmission channel, the LLR ratio for the bit d in relation to the signal y is defined as:

$$LLR(y) = LLR(d/y) = \ln \frac{P(d=0/y)}{P(d=1/y)}$$

where P(d=0/y) is the probability that the sent bit d is equal to 0 as a function of the received value y, and P(d=1/y) is the probability that the sent bit d is equal to 1 as a function of the received value y.

The LDPC decoder uses internal metrics, equal in number to the number of "1" values in the H matrix, and each coded in a number t of bits. The decoder updates these metrics using an iterative algorithm.

To decode an LDPC block received in order to recover a block of N data sent, the decoder performs multiple iterations, for example about fifty iterations. Each internal metric converges towards a given value.

The decoded bits, called hard decision bits, are then obtained by adding the internal metrics by column with the LLRs received. In a decision step, the sign of the sum allows determining the value of the decoded bit.

With reference to FIG. 3, the typical architecture of a prior art LDPC decoder comprises an input memory or channel memory 41 (denoted CH_MEM in the figure), capable of storing a number 2×N of LLRs. More particularly, the memory 41 comprises a first storage element 41a for storing the N LLRs of the previously received block which is currently being decoded, and a second storage element 41b for storing the N LLRs of a block currently being received.

The decoder also comprises processing means. In order to accelerate the calculations related to decoding, said processing means comprise a methodor bank 42. These P methodors (denoted Proc1 to ProcP in FIG. 3) perform in parallel the update calculations by row and by column. The number P is called the parallelism index.

During execution of the iterative method, the methodors deliver updated values of internal metrics, each coded in t bits. The internal metrics are stored in a metric memory 43 (denoted MET_MEM in FIG. 3). The internal metrics stored in the memory 43 are delivered to the methodor bank 42 via a P-channel mixer, such as a barrel shifter 44 (denoted BS in FIG. 3) in the case of the DVB-S2 standard. The memory 43 is read and write accessible via respective buses of t×P wires.

During the last iteration, the methodors 42 also deliver K or N hard decision bits, which assume the values "1" or "0" depending on the sign of the sum of the columns of the H matrix and the corresponding LLRs. This set of K or N hard decision bits is stored temporarily in an output memory, or hard decision memory 45 (denoted HD_MEM in FIG. 3). The methodor bank 42 can write to the hard decision memory 45 via a bus of P wires.

The double encoding of information bits in order to better protect against noise is already known. FIG. 4 shows an example of such a concatenation. The channel encoder 53 adds redundancy on the side of the transmitter 10 to enable the receiver 30 to correct potential errors due to the noise N introduced into the transmission channel 20. For example, K1 information bits are first encoded using a BCH encoding algorithm. The N1 BCH encoded bits constitute the K2 bits to be encoded using an LDPC algorithm. N2-N1 redundancy bits are thus added to the N1 BCH encoded bits. N2 encoded bits are then obtained.

The channel encoder 53 comprises a BCH encoding device 51 and an LDPC encoding device 52.

Upon receipt, the received signals are converted into LLRs then decoded using the LDPC decoding algorithm corresponding to the LDPC encoding performed. The bits decoded using the LDPC decoding algorithm are then decoded using a BCH decoding algorithm corresponding to the BCH encoding performed. The channel decoding device 54, on the side of the receiver 30, comprises an LDPC decoding device 56 and a BCH decoding device 57.

The LDPC decoding device may, for example, comprise an LDPC decoder such as the one represented in FIG. 3.

The BCH decoding device may comprise a decoding device such as the one represented in FIG. 2.

The LDPC decoder presents a parallelism index P, for example 360, for accelerating the processing of the LLRs. Therefore P hard decision bits are written simultaneously to the hard decision memory. K2/P write cycles are thus necessary to write the K2 LDPC decoded bits to the hard decision memory. These K2 LDPC decoded bits, or in other words the N1 BCH encoded bits, are next sent sequentially to the error detection means, then to the correction means for the BCH decoding device.

It is possible to replace the hard decision memory 45 in FIG. 3 and the FIFO buffer 24 in FIG. 2 with a single intermediate buffer which receives the hard decision bits from the methodor bank P and sequentially sends the N1 bits to the error detection means then to the correction means.

FIG. 5 shows an example of timing diagrams for a decoding device with a single intermediate buffer. The first timing diagram corresponds to the sets of N2 bits processed by the LDPC decoder. The second timing diagram corresponds to the sets processed by the error detection means of a BCH decoding device. The third timing diagram corresponds to the sets processed by the correction means of the BCH decoding device.

In these timing diagrams the latency from calculating the error locator polynomial is considered to be negligible.

A first set is processed by the P methodors of the LDPC decoder until time t1. The LDPC_p variable is an index which assumes the values of whole numbers indicating which set the LDPC decoder is currently processing.

Between time t0 and time t1, K2 (or N1) hard decision bits are written to the intermediate buffer during the last LDPC iteration. These K2 bits are sent sequentially to the error detection means and processed between times t1 and t2. The BCH_p variable indicates which set of K2 bits the error detection means are currently processing.

Between times t2 and t3, the erroneous bits are corrected. The BCH_output variable indicates which set the correction means are currently processing. The correction means perform bitwise addition of a vector output from the error detection means and K1 hard decision bits corresponding to the K1 BCH information bits. The intermediate buffer must send the K1 hard decision bits one at a time to the correction means between times t2 and t3. The intermediate buffer therefore cannot receive new hard decision bits corresponding to a new set before time t3. The number K1 of BCH information bits may be relatively close to N1, such that the duration between times t2 and t3 may be relatively close to the duration between times t1 and t2.

With existing LDPC and BCH decoding devices, the decoding step using the BCH algorithm may well limit the bit rate of the LDPC decoding.

It is known to use two buffers rather than a single intermediate buffer. The N1 hard decision bits may be stored in either buffer.

FIG. 6 shows examples of timing diagrams for a decoding device with two buffers. The variables MEM_1 and MEM_2 respectively indicate which set of N1 bits is stored in the first buffer and second buffer over time.

As before, the latency from calculating the error locator polynomial is considered to be negligible.

At time t0, a set, corresponding to an index with a value of 0, is processed by the LDPC decoder and N1 hard decision bits are written to the first buffer. As described above, the first buffer must sequentially send these N1 bits to the error detection means in order to be processed between times t0 and t1. The first buffer must then sequentially send K1 bits of the stored N1 bits to the correction means between times t1 and t2. The correction means in fact use data generated by the error detection means based on the same hard decision bits. The first buffer is therefore not available for a new set before time t2. The number K1 of BCH information bits may be relatively close to N1, such that the duration between times t1 and t2 may be relatively close to the duration between times t0 and t1.

However, a new set of N1 hard decision bits may be decoded and written to the second memory at time t1. Even if the latency is approximately two sets, the error detection means are more regularly used than in the device with a single intermediate buffer.

With existing decoding devices, it is the LDPC decoder here which limits the bit rate for the decoded data.

BRIEF SUMMARY OF THE INVENTION

One embodiment of the present invention allows, with a single buffer, decoding at about the same bit rate as a two-buffer device. In a first embodiment, a channel decoding method is described. Bits decoded using a first iterative block decoding algorithm are decoded using a second block decoding algorithm, such that the bits of a set of N1 bits decoded using the first block decoding algorithm and intended to be decoded using the second block decoding algorithm, are sent in parallel in at least one subset of P bits to a buffer for temporary storage. The decoding method comprises a step where at least one subset of Q bits of the set of N1 bits sent to the buffer memory is received in parallel. The decoding method also comprises an error detection step using the second block decoding algorithm, based on the bits decoded using the first block decoding algorithm. Lastly, the decoding method comprises a correction step for the bits stored in the buffer, based on the possible errors detected. The error detection step and/or the correction step for the bits stored in the buffer comprise a parallel processing of the bits of each subset of Q bits received.

Thus, the N1 bits decoded using the first decoding algorithm are received as one or more subsets of Q bits, and the bits of each subset of Q bits received are processed in parallel, without storing them. In the prior art, the bits of a set of N1 decoded bits are sent one by one a first time, for the error detection, then a second time for the correction. The method according to one embodiment allows reducing the duration of at least one of these transmissions.

The method according to one embodiment also allows reducing the time during which the buffer is not available for receiving a new set of N1 decoded bits, and does so with only one buffer.

The implementation of the method according to one embodiment may be accompanied by an increase, relative to the prior art, of the surface area dedicated to the decoding which uses the second block decoding algorithm. However, if the surface area of a buffer of N1 bits is larger than this increase in surface area, the total surface area can be reduced in comparison to the prior art device with two buffers.

The set of N1 decoded bits corresponds to a codeword.

In one embodiment, the error detection step comprises a parallel processing of the bits in each subset of Q bits received.

Alternatively, in one embodiment, said at least one chosen step is the correction step for the bits stored in the buffer. Alternatively, the error detection step and the correction step for the stored bits both comprise a parallel processing of the bits in each bit subset.

In one embodiment, the bits in the set of N1 bits decoded using the first iterative block decoding algorithm are sent in parallel in multiple subsets of P bits to the buffer, which thus reduces the surface area used.

Alternatively, in one embodiment, the N1 decoded bits are sent in a single cycle to the buffer, meaning P=N1.

In one embodiment, the method also comprises a partial serialization step so that multiple subsets of Q bits are received. The error detection is performed based on several subsets of Q bits. This partial serialization step enables, given there is a relatively slight increase in the time during which the buffer is not available, reducing the surface area occupied by the error detection means.

In one embodiment, P is a multiple of Q. Thus each subset of P bits decoded using the first decoding algorithm is divided into j subsets of Q bits. Multiple subsets of Q bits may thus be obtained from the same subset of P bits, enabling a multiplexing which is relatively simple to implement.

For example, if each subset of P bits is received in the buffer for purposes of error detection, the bus of Q bits may be formed relatively easily, in a step where the stored bits are read from a single buffer address.

This optimization would not limit the invention. For example, a single subset of Q bits may be received for each subset of P bits sent, meaning Q=P. When the N1 decoded bits are sent in a single cycle to the buffer, the value of Q may even reach N1. The time necessary for the decoding of the N1 bits using the second decoding algorithm is thus relatively short, releasing the buffer relatively quickly.

Alternatively, in one embodiment, subsets of only two bits are received in parallel at each clock cycle, meaning Q=2. The error detection means therefore occupy a relatively small surface area. The time necessary for decoding the N1 bits using the second decoding algorithm is at any rate less than the prior art decoding time when a single intermediate buffer is used.

In one embodiment, the error detection step comprises a syndrome calculation step. In particular, the second block decoding algorithm may comprise a BCH or Reed-Solomon algorithm.

The present invention is not limited by this syndrome calculation step, nor by the nature of the first decoding algorithm, nor by the nature of the second decoding algorithm. In a second embodiment, a channel decoding device comprises a first decoding device and a second decoding device, where the second decoding device enables using a second block decoding algorithm to decode bits coming from the first decoding algorithm, such that the bits of a set of N1 bits decoded by the first decoding device using a first iterative block decoding algorithm and intended to be decoded using the second block decoding algorithm, are sent in parallel in at least one subset of P bits to a buffer. The second decoding device comprises error detection means for detecting errors using the second block decoding algorithm, based on the bits coming from the first decoding device. The second decoding device also comprises correction means for the bits stored in the buffer, based on any errors detected. The error detection means and/or the correction means for the bits stored in the buffer comprise parallel processing means configured to receive at least one subset of Q bits in parallel among the N1 bits sent, and to method in parallel the bits of each subset of Q bits.

The device according to this embodiment allows implementing the method according to the first embodiment, and therefore offers the same advantages.

It is of little importance whether the parallel processing means receives the Q-bit subsets from the buffer or directly from the decoding means of the first decoding device.

It is also of little importance whether the buffer is part of the first decoding device or the second decoding device.

In one embodiment, at least one multiplexing device allows dividing up the set of N1 bits sent to the parallel processing means over multiple clock cycles. Said at least one multiplexing device allows partial serialization of the N1 decoded bits.

In one embodiment, said multiplexing device allows dividing each subset of P bits sent into multiple subsets of Q bits.

Alternatively, in one embodiment, partial serialization means may be used. This partial serialization allows, given a relatively slight increase in the time during which the buffer is not available, reducing the surface area occupied by the parallel processing means.

The device according to the second embodiment is of course not limited by the presence of partial serialization means.

For example, a single subset of Q bits may be received for each subset of P bits sent, meaning Q=P, thus avoiding the multiplexing device.

In one embodiment, the channel decoding device can be integrated with a methodor.

DETAILED DESCRIPTION OF THE INVENTION

Examples of Channel Decoding Devices

Figure 1:
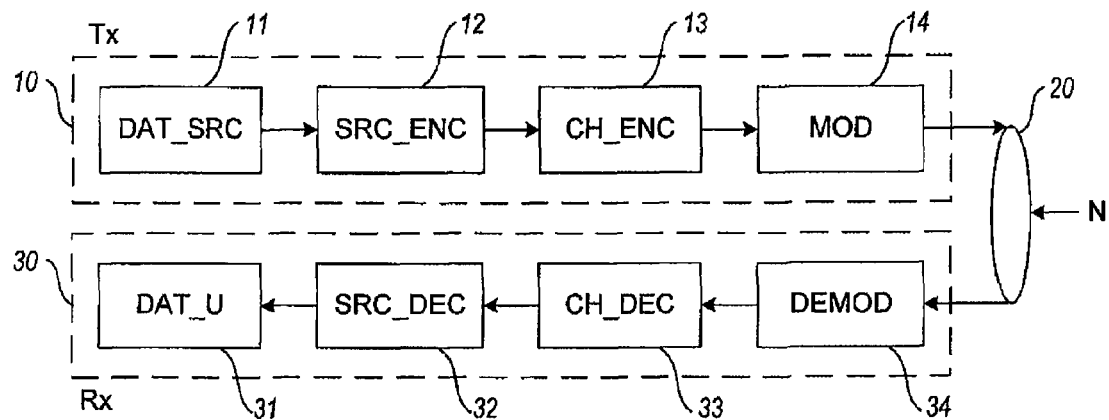
FIG. 1, already mentioned, is a diagram showing an example of a prior art transmission subsystem.
Figure 2:
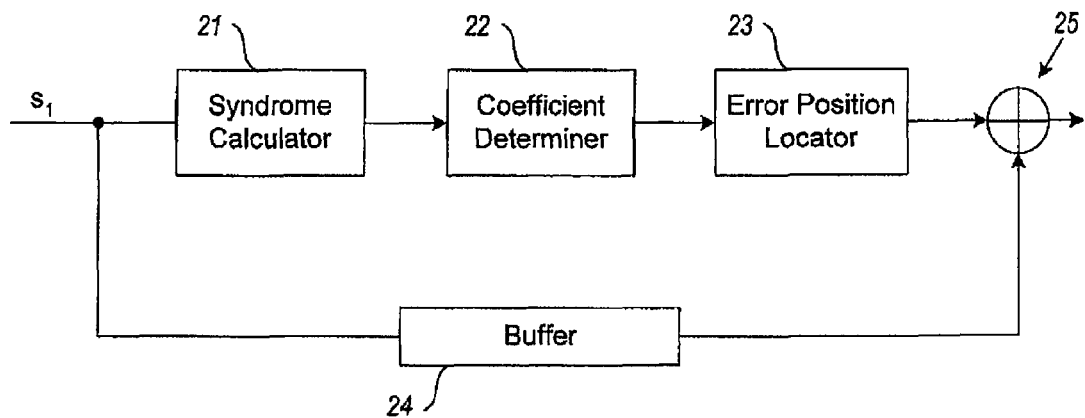
FIG. 2, already mentioned, shows an example of a decoding algorithm using a BCH algorithm, which is known in the prior art.
Figure 3:
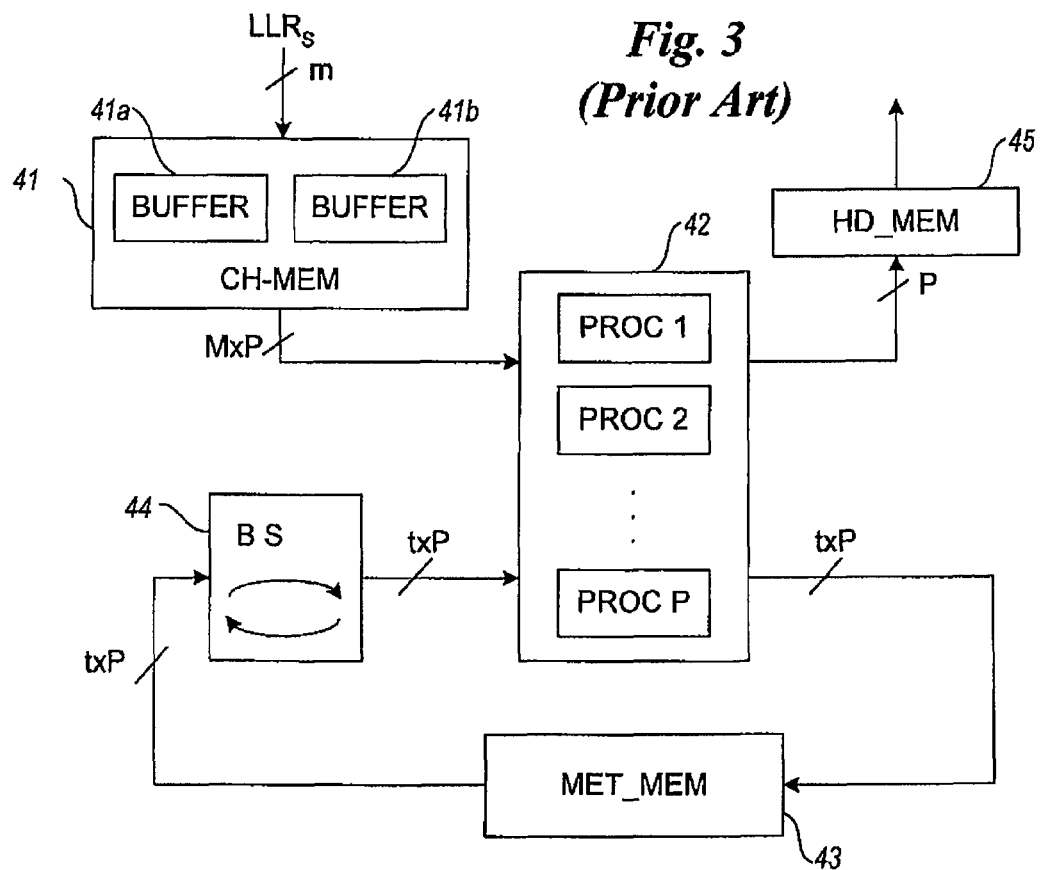
FIG. 3, already mentioned, shows an example of a decoding device according to an LDPC algorithm, which is known in the prior art.
Figure 4:
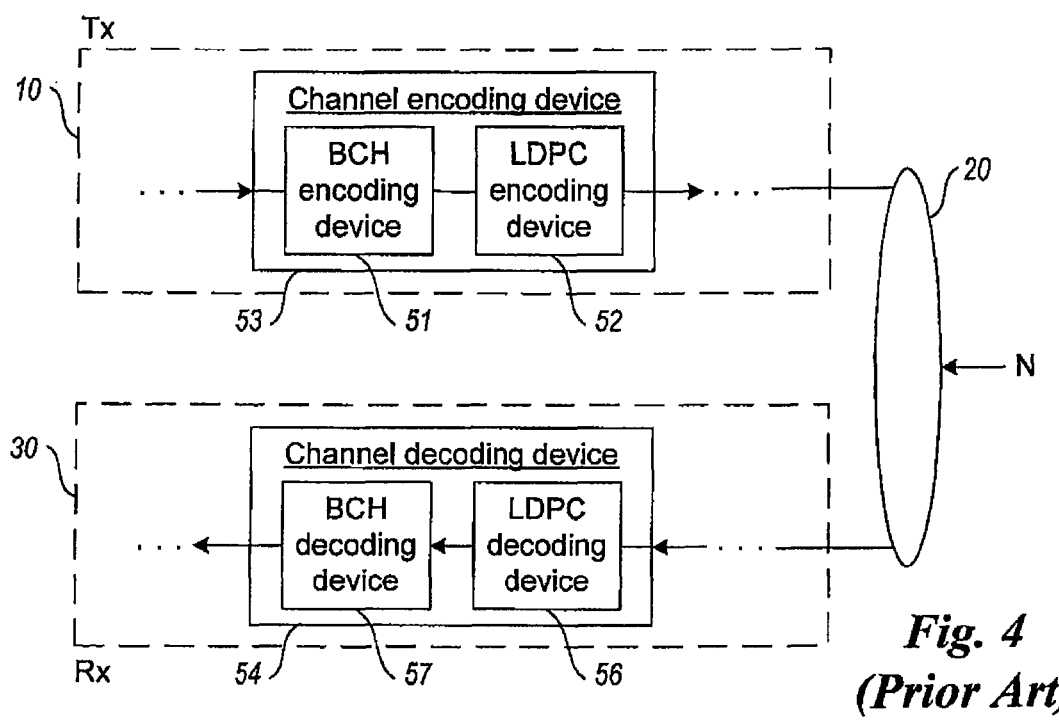
FIG. 4, already mentioned, is a diagram showing an example of a transmission subsystem with concatenation of two coding algorithms, which is known in the prior art.
Figure 5:
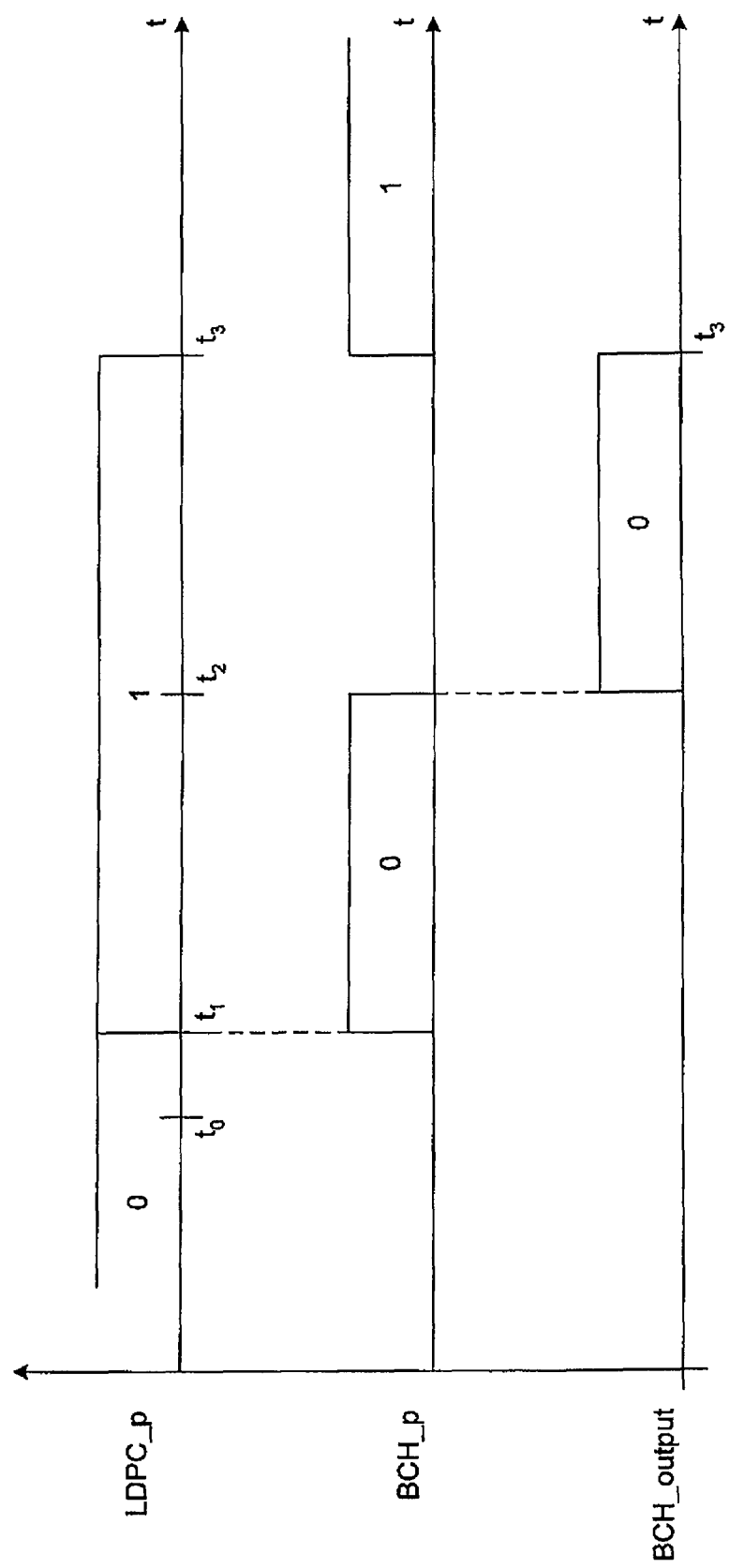
FIG. 5, already mentioned, shows examples of timing diagrams for a decoding device with a single intermediate buffer, which is known in the prior art.
Figure 6:
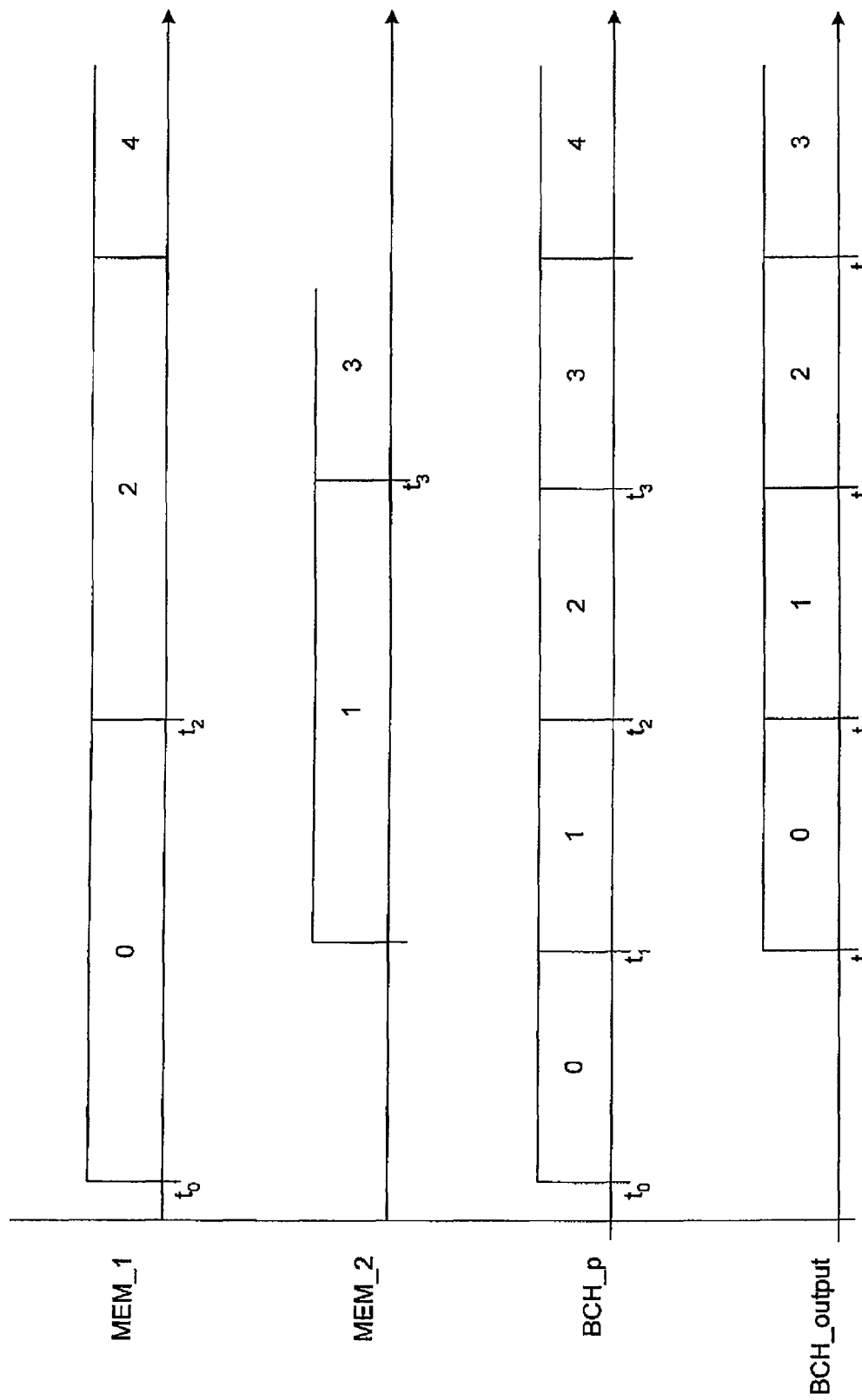
FIG. 6, already mentioned, shows examples of timing diagrams for a decoding device with two buffers, which is known in the prior art.
Figure 7:
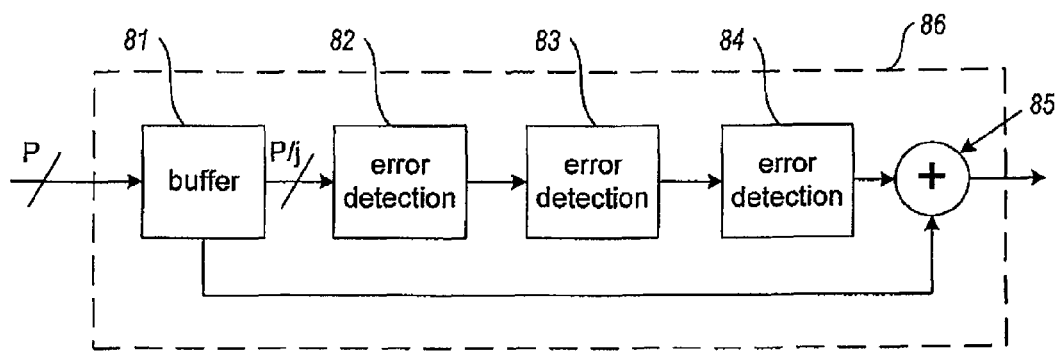
FIG. 7 shows an example of a channel decoding device according to a first embodiment.
Figure 8:
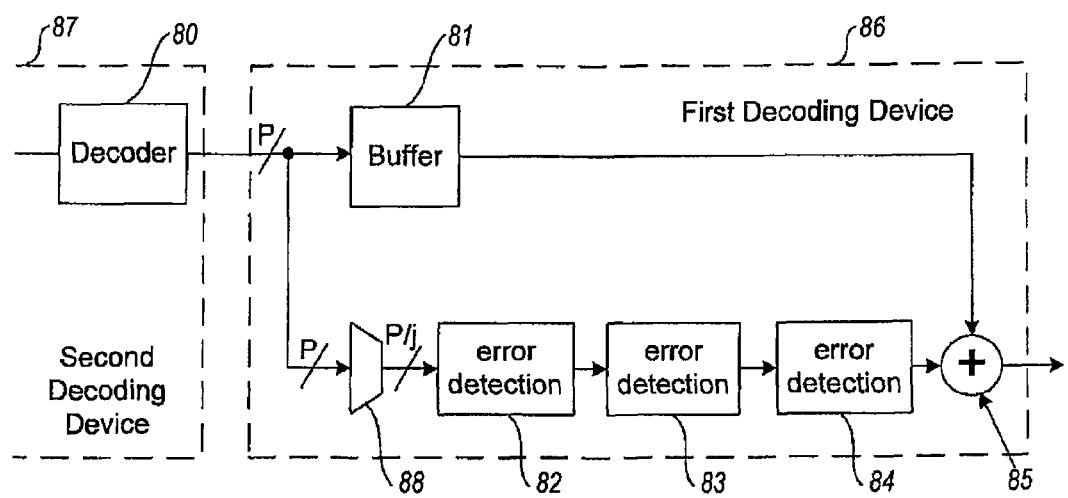
FIG. 8 shows an example of a channel decoding device according to a second embodiment.

FIGS. 7 and 8 show two examples of a channel decoding device according to one embodiment, and will be discussed together.

The channel decoding device comprises a first decoding device 87 and a second decoding device 86. The first decoding device is not represented in FIG. 7.

The first decoding device comprises decoding means (reference 80 in FIG. 8) for decoding bits using a first iterative block decoding algorithm such as, but not limited to, an LDPC algorithm. The LDPC decoding is performed with a parallelism index P, for example 360 or 72. At the last iteration, K2 (or N1) bits are therefore decoded and are sent in parallel as subsets of P bits to a buffer 81, in order to be decoded by the second decoding device using a second block decoding algorithm.

Alternatively, in an embodiment not represented, K2 (or N1) decoded LDPC bits are sent in parallel as subsets of P bits to a buffer 81, with P being less than the parallelism index P' of the first LDPC decoding device.

In the two embodiments represented, the buffer 81 is part of the second decoding device.

The second decoding device additionally comprises error detection means (82, 83, 84) for detecting errors using the second decoding algorithm.

The second decoding algorithm may, for example, comprise a BCH algorithm or a Reed-Solomon algorithm. In the examples represented in FIGS. 7 and 8, it is a BCH algorithm which is applied.

The error detection means comprise syndrome calculation means 82 for calculating a syndrome from the bits sent, as well as error locator polynomial determination means 83 and error position locator means 84 for locating errors based on the error locator polynomial. The error position locator means may apply a Chien search algorithm.

The second decoding device additionally comprises correction means for the bits stored in the buffer, for example an adder 85.

The syndrome calculation means 82 are designed to simultaneously receive Q bits of the N1 decoded bits. The bits of at least one subset of Q bits are received in parallel and processed by the syndrome calculation means without storing them at input.

In the embodiments represented, each subset of P bits sent to the buffer is divided into multiple subsets of Q bits. In particular, P is a multiple of Q, meaning Q=P/j.

In the first embodiment, represented in FIG. 7, the syndrome calculation means receive from the buffer 81 the bits decoded by the first decoding device. Subsets of Q=P/j bits are sent from the buffer 81 as the subsets of P bits are received.

In an alternative embodiment not represented in the figures, the subsets of Q bits are only sent by the buffer to the syndrome calculation means when all the bits of the set of N1 bits have been received by the buffer.

In the second embodiment, represented in FIG. 8, the bits decoded by the first decoding device 87 are sent to the buffer 81 and to the syndrome calculation means 82, here via the multiplexing device 88. The multiplexing device 88 enables partial serialization of each subset of P bits. The syndrome calculation means 82 receive the N1 bits in several clock cycles, with Q bits received and processed during each clock cycle.

In the two embodiments, the buffer 81 enables temporarily storing the bits decoded by the first decoding device 87.

The adder 85 enables correcting the bits stored in the buffer 81, based on possible errors detected by the error position locator means 84. The error position locator means 84 may sequentially send a vector of K1 bits. The bits of this vector are zeroes except for the bits occupying the positions detected as the positions of the erroneous bits in the bits stored in the buffer 81. When the bits in this vector are added bitwise to the bits in the buffer 81, the values of the erroneous bits are corrected.

The buffer therefore keeps a set of K1 bits in memory in order to send them one by one to the adder 85 once the error positions are detected. The syndrome calculation is done relatively quickly, and therefore the buffer is available relatively quickly to receive a new set of N1 bits.

Examples of Timing Diagrams

Figure 9:
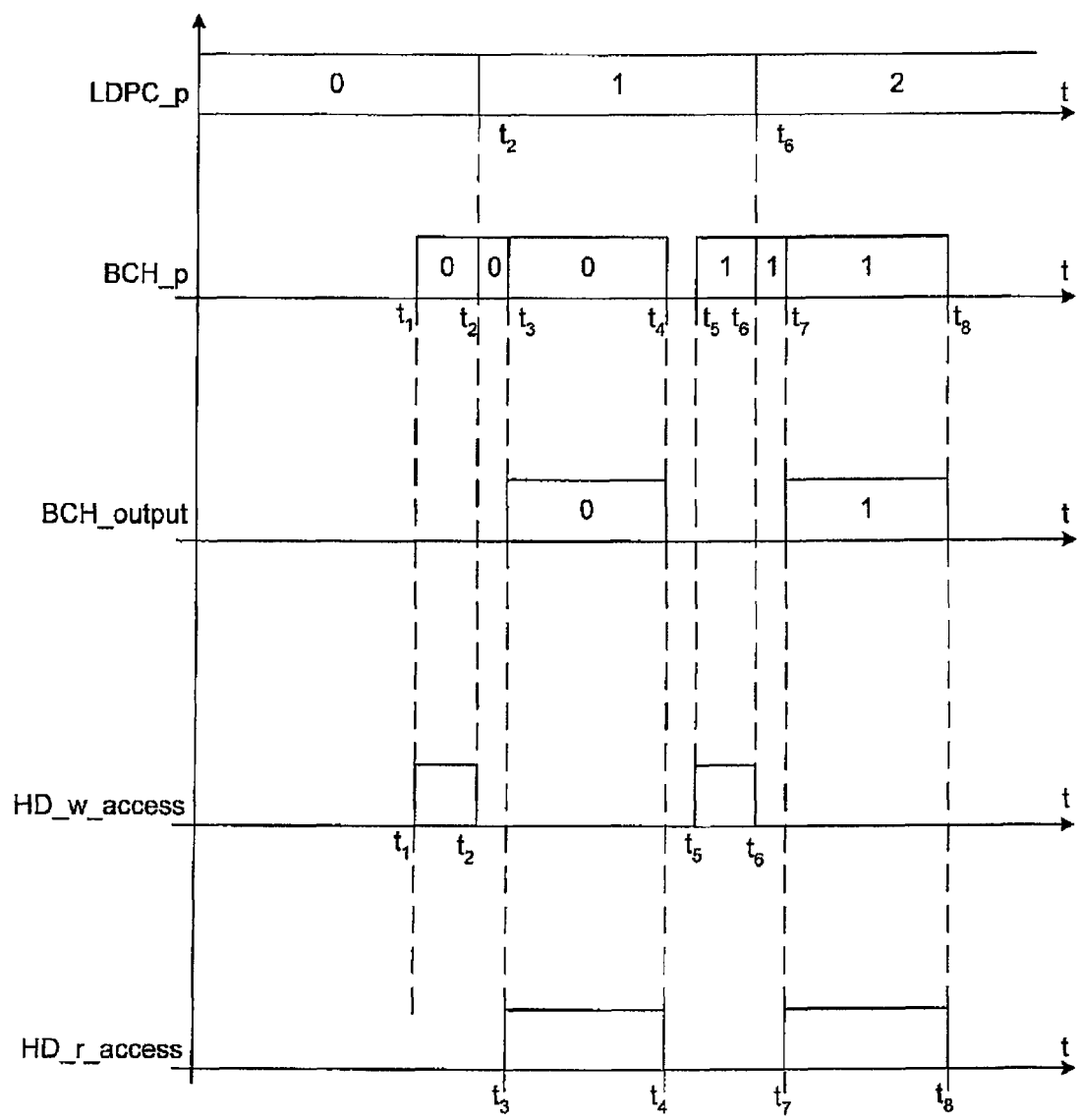
FIG. 9 shows an example of timing diagrams for a decoding device according to a third embodiment.

FIG. 9 shows an example of timing diagrams for a decoding device according to a third embodiment.

The first timing diagram corresponds to the sets of N2 bits processed by a first decoding device using an LDPC algorithm. A first set, corresponding to an index with a value of 0, is processed by the P methodors of an LDPC decoder. The LDPC_p variable indicates which set is currently being decoded by the first decoding device.

The second timing diagram corresponds to the sets processed by the error detection means of a second decoding device using a BCH algorithm. The BCH_p variable indicates which set is currently being processed by the error detection means.

The third timing diagram corresponds to sets processed by the correction means of the second decoding device. The BCH_output variable indicates which set is currently being processed by the correction means.

The fourth timing diagram corresponds to the periods of writing to the buffer. The HD_w_access variable indicates the moments when the buffer is written to.

The fifth timing diagram corresponds to the periods of reading from the buffer. The HD_r_access variable indicates the moments when the buffer is read from.

In this embodiment, each set of N1 bits decoded by a first decoding device is sent in parallel P bits at a time to a buffer and to the syndrome calculation means.

The buffer only stores K1 of the N1 bits received, because such storage is only useful for the correction of the K1 BCH information bits. The capacity of the buffer can therefore be limited to K1 bits.

Thus, the LDPC decoding of the first set ending at time t2 comprises, in addition to the processing by the P methodors, a step where N1 decoded bits are sent to the buffer and a step where N1 decoded bits are sent to the syndrome calculation means of the second decoding device. These two steps are performed simultaneously between times t1 and t2. The syndrome calculation means receive and method these N1 bits roughly between times t1 and t2. The buffer is written to between times t1 and t2. The HD_w_access variable therefore assumes a non-zero value roughly between times t1 and t2, and the BCH_p variable indicates that the error detection means are currently processing the first set.

When these two steps are completed, at time t2, the P methodors of the LDPC decoder can method a new set, corresponding to an index with a value of 1.

Between times t2 and t3, the syndrome calculated by the syndrome calculation means is processed by the error locator polynomial determination means of the second decoding device.

Between times t3 and t4, the error position locator means of the second decoding device sends one by one to the correction means the bits of a vector of K1 bits. This vector of K1 bits is sent at the same time as the K1 bits stored in the buffer. The HD_r_access variable therefore has a non-zero value between times t3 and t4.

In an alternative embodiment not represented in the figures, the error position locator means of the second decoding device sends in parallel to the correction means the bits of the vector of K1 bits. The buffer also sends in parallel to the correction means the stored K1 bits. The time spent in the BCH decoding is thus particularly low.

Returning to FIG. 9, at time t4 the buffer is therefore available to receive a new set of bits. It is the LDPC decoder which limits the bit rate for the decoded data, although a single buffer is used. The latency introduced by the BCH decoding is one set only.

We have seen, as represented in FIG. 7, that the N1 bits received by the syndrome calculation means may come from the buffer. In this case, the buffer must have a capacity of N1 bits. The buffer may be used for partial serialization of the bits received from the first decoding device.

In particular, the subsets of Q bits may be sent as the bits of the set of N1 bits are received. The BCH_p variable then indicates that the error detection means are currently processing the first set starting roughly at time t1, as is shown in the timing diagrams in FIG. 9.

Alternatively, the subsets of Q bits may be sent once the set of N1 LDPC decoded bits is received. The BCH_p variable then indicates that the error detection means are currently processing the first set starting roughly at time t2. The decoding by the second device therefore begins slightly later than in the third embodiment. The buffer may, however, be available relatively quickly, such that it is still the LDPC decoder which limits the bit rate for the decoded data. The latency introduced by the BCH decoding is one set.

Syndrome Calculation Means

The syndrome calculation means enable calculating 2*t syndrome components. For n decoded bits IN(i) corresponding to a BCH codeword of size n, with i ranging from 0 to (n−1), each component S(k) of the syndrome, with k ranging between 1 and 2*t, is defined as $$S(k) = \sum_{i=0}^{n-1} IN(i)\alpha^{k(n-1-i)},$$

where $\alpha$ is a primitive element of the Galois field of the corresponding encoding algorithm.

It is assumed in this example that Q=P. By choosing n and P values such that n is a multiple of P, it is possible to divide this sum of n terms into sub-sums of P terms each:

$$S(k) = \left[\sum_{i=0}^{P-1} IN(i)\alpha^{k(P-1-i)}\right]\alpha^{k(n-P)} + \left[\sum_{i=0}^{P-1} IN(P+i)\alpha^{k(P-1-i)}\right]\alpha^{k(n-2P)} + \ldots + \left[\sum_{i=0}^{P-1} IN(n-P+i)\alpha^{k(P-1-i)}\right]$$

Figure 10:
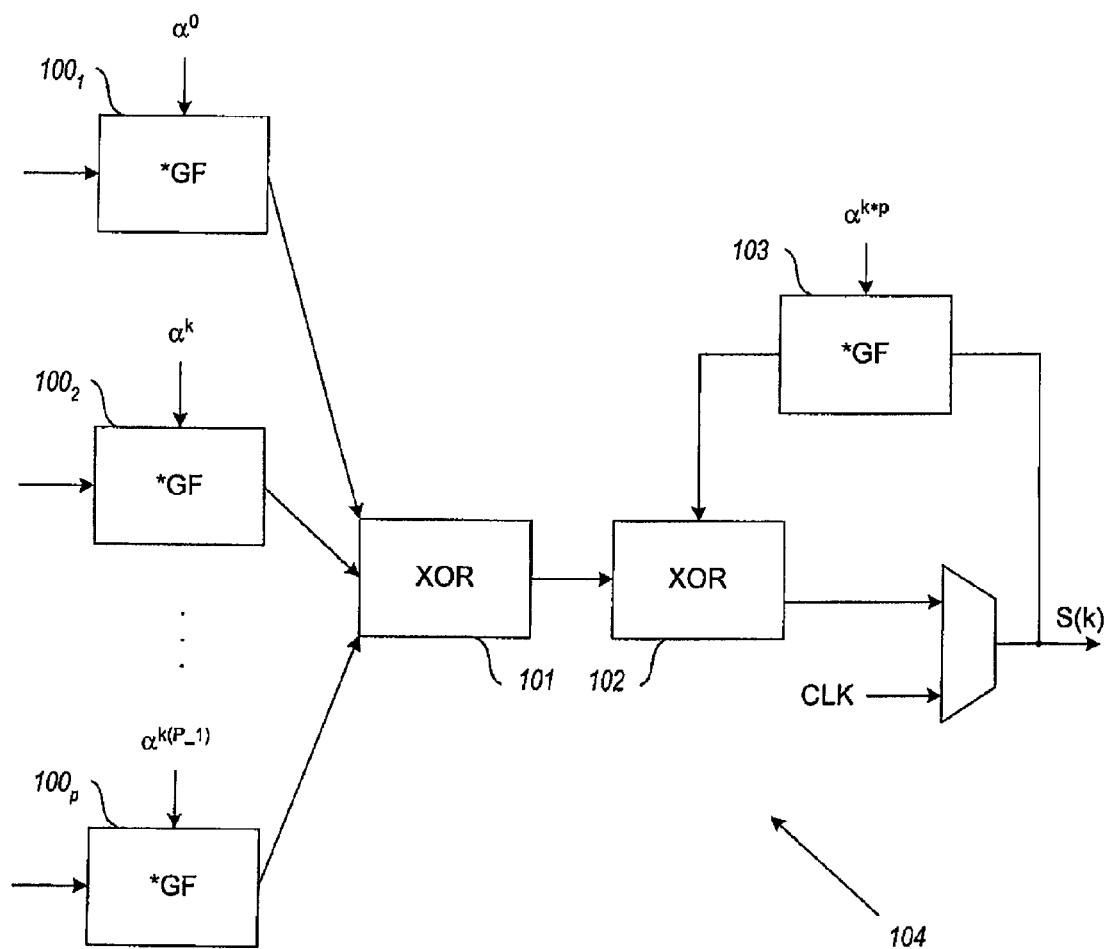
FIG. 10 shows an example of syndrome component calculation means according to at least one embodiment.

FIG. 10 shows the calculation means for component S(k) 104. These calculation means for component S(k) 104 are designed to receive subsets of P IN(i) bits in parallel. Each IN(i) bit is sent to a multiplier (100$_1$, 100$_2$, ..., 100$_P$) in order to be multiplied by a factor $\alpha^{k(P-1-i)}$ in the Galois field. A first EXCLUSIVE OR gate 101 sums within the Galois field to obtain a first term $$\left[\sum_{i=0}^{P-1} IN(i)\alpha^{k(P-1-i)}\right].$$

At the leading edge of a clock pulse, a multiplier 103 multiplies this first term in the Galois field by a factor $\alpha^{kP}$.

During this time, a new subset of P decoded bits is received. Each bit of the new subset is multiplied by one of the multipliers ($100_1, 100_2, \ldots, 100_P$) in the Galois field by a factor $\alpha^{k(P-1-i)}$. The first EXCLUSIVE OR gate 101 sums within the Galois field in order to obtain a second term $$\left[\sum_{i=0}^{P-1} IN(i+P)\alpha^{k(P-1-i)}\right].$$

The first term and the second term are added within the Galois field by a second EXCLUSIVE OR gate 102.

At the leading edge of a new clock pulse, the multiplier 103 multiplies the added first term and second term by a factor $\alpha^{kP}$. During this time, a new set of decoded bits is received, resulting in a third term.

After a certain number of clock cycles, on the order of the ratio n/P, the component S(k) can be retrieved at the output.

The calculation means for a component ($104_1, 104_2, \ldots, 104_{2t}$) occupy a relatively small surface area, while enabling parallel reception of P decoded bits.

In an alternative embodiment not represented in the figures, P/j decoded bits are received in parallel by the syndrome calculation means, where j is the number of clock cycles necessary to receive P bits. The component calculation means may be of the same type as those represented in FIG. 10, provided that the ratio n/(P/j) is a whole number.

Figure 11A:
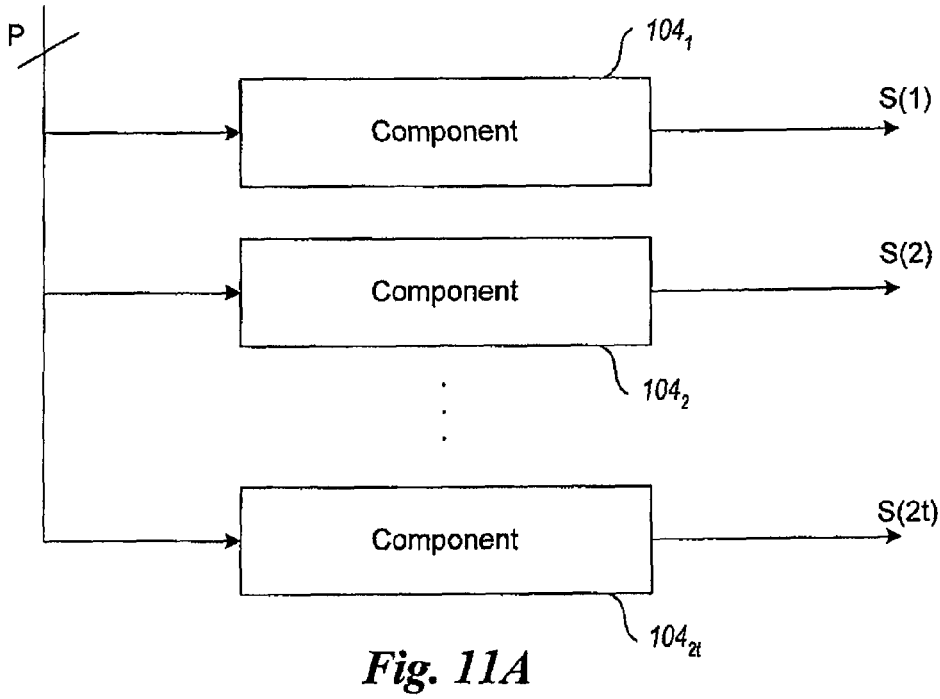
FIG. 11A shows an example of syndrome calculation means according to at least one embodiment.

FIG. 11A shows syndrome calculation means according to one embodiment. The syndrome calculation means comprise 2*t component calculation means ($104_1, 104_2, \ldots, 104_{2t}$).

Figure 11B:
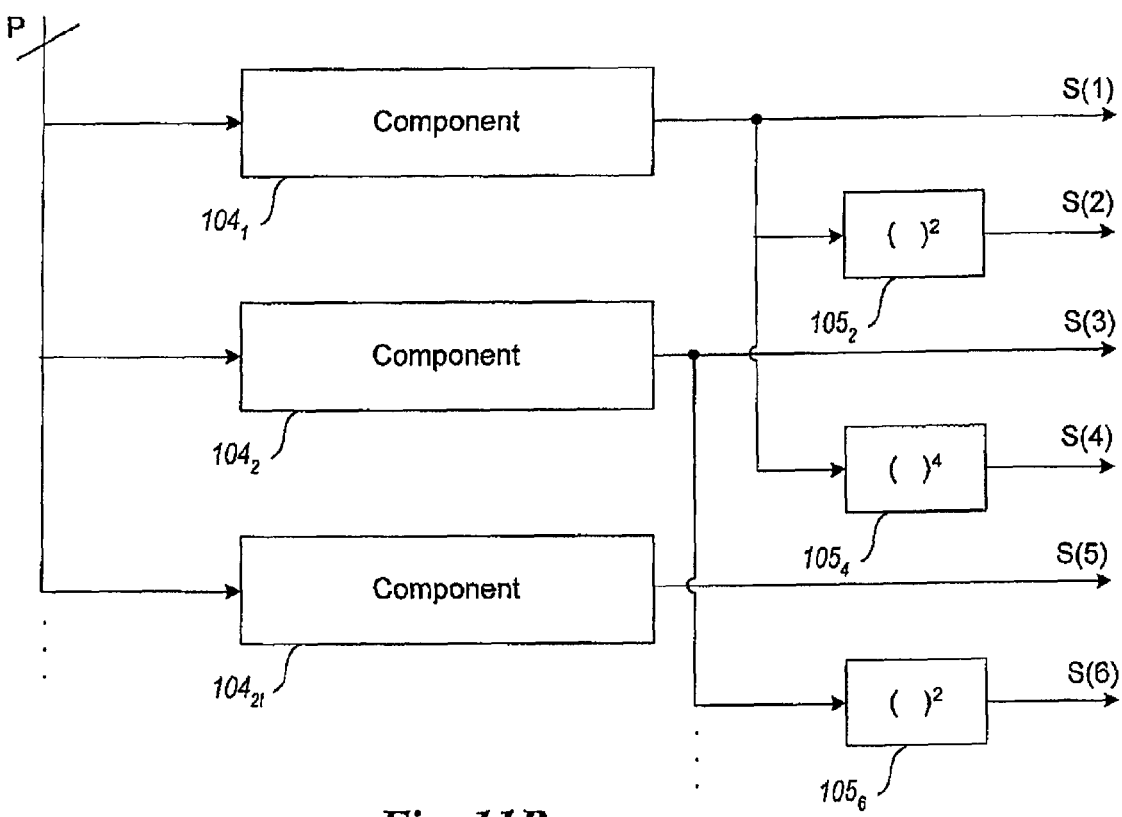
FIG. 11B shows an example of syndrome calculation means according to at least one embodiment.

FIG. 11B shows syndrome calculation means according to one embodiment. This embodiment uses the principle where $$S(2k)=(S(k))^2$$

The syndrome calculation means comprise a relatively low number of component calculation means ($104_1, 104_3, 104_5, \ldots$). Certain components (S(1), S(3), S(5), ...) are calculated from the corresponding component calculation means ($104_1, 104_3, 104_5, \ldots$). Other components, for which k is an even number, are calculated by squaring other components. For example, the power of 2 means ($105_2, 105_6, \ldots$) allow obtaining the components S(2) and S(6) from the respective components S(1) and S(3). The power of 4 means enable obtaining component S(4) from component S(1).

The syndrome calculation means in this embodiment economize both surface area and power. For example, when decoding under the DVB-S2 standard with a parallelism index P of 72 and using CMOS technology, the syndrome calculation means in this embodiment can occupy a surface area of about 0.1 mm². The syndrome calculation means in the embodiment represented in FIG. 11A occupy a surface area of about 0.2 mm² under the same conditions.

Variants

The second decoding algorithm may, for example, comprise a Reed-Solomon algorithm. In this case, the error position locator step may implement a Forney algorithm, in addition to a Chien search algorithm.

The parallel processing means may comprise correction means for stored bits. The correction means, for example Q EXCLUSIVE OR gates, receive in parallel from the buffer at least one subset of Q bits from the set of N1 bits. For each subset of Q bits received, the correction means receive in parallel from the error detection means a subvector of Q bits indicating the bits to be corrected. At each cycle, the Q EXCLUSIVE OR gates add the Q bit values of the subset to the Q bit values of the subvector, which corrects the bits stored in the buffer.

The sending of bits originating from the first decoding device to the error detection means may be done serially, bit by bit, or by subsets of Q' bits. In the latter case, Q' may have the same value as Q or a different value. Q' may be between 2 and N1.

When the error detection means and the correction means receive in parallel the N1 decoded bits as subset(s) of Q bits, the buffer can be released relatively quickly, thus further reducing the decoding time for the second decoding device.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A channel decoding method, comprising:
    decoding a set of input bits using an iterative first block decoding algorithm so as to obtain a set of decoded bits;
    sending in parallel at least one first subset of bits of the set of decoded bits to a buffer for temporary storage;
    decoding the first subset of bits using a second block decoding algorithm, the decoding the subset of bits including:
    receiving in parallel at least one second subset of bits belonging to the first subset of bits sent to the buffer;
    detecting errors using the second block decoding algorithm, based on the bits decoded using the first block decoding algorithm; and
    correcting the bits stored in the buffer based on the errors detected in the detecting step,
    wherein the detecting errors and/or correcting the stored bits comprise parallel processing the bits of each second subset of bits received.

2. The channel decoding method according to claim 1 wherein the detecting errors comprises parallel processing the bits of each second subset of bits received.

3. The channel decoding method according to claim 1 wherein the bits of the set of input bits decoded using the first block decoding algorithm are sent in parallel in multiple subsets of bits to the buffer.

4. The channel decoding method according to claim 1 further comprising partially serializing each first subset bits such that multiple second subsets bits are received.

5. The channel decoding method according to claim 1 wherein detecting errors comprises performing one or more syndrome calculations.

6. The channel decoding method according to claim 1 wherein the first block decoding algorithm comprises a low-density parity code (LDPC) algorithm.

7. The channel decoding method according to claim 1 wherein the second block decoding algorithm comprises a Bose/Ray-Chaudhuri/Hocquenghem (BCH) algorithm.

8. The channel decoding method according to claim 1 wherein the second block decoding algorithm comprises a Reed-Solomon algorithm.

9. A channel decoding device, comprising:
    a first decoding device structured to decode a set of input bits using a first iterative block decoding algorithm so as to obtain a set of decoded bits; and
    a second decoding device structured to use a second block decoding algorithm to decode the decoded bits originating from the first decoding device, such that the bits of the set of decoded bits are sent in parallel in at least one first subset of bits to a buffer, the second decoding device including:

error detection means for detecting errors using the second decoding algorithm, based on bits originating from the first decoding device; and correction means for bits stored in the buffer, based on any errors detected;

wherein the error detection means and/or the correction means comprise parallel processing means designed to receive in parallel at least one second subset of bits of the decoded bits sent, and to parallel process the bits of each second subset of bits received.

10. The channel decoding device according to claim 9 further comprising at least one multiplexing device for dividing up the decoded bits sent to said parallel processing means over multiple clock cycles.

11. A channel decoding method, comprising:

decoding a set of input bits using a first iterative block decoding algorithm, so as to obtain a set of decoded bits;

sending in parallel at least one first subset of bits of the set of decoded bits to a buffer for temporary storage;

decoding the at least one first subset of bits using a second block decoding algorithm, the decoding the at least one first subset of bits including:

partially serializing each first subset of bits into plural second subsets of bits;

receiving in parallel each of the plural second subsets of bits;

detecting possible errors by performing one or more syndrome calculations based on the bits decoded using the first block decoding algorithm, wherein detecting possible errors comprises parallel processing the bits of each second subset of bits received; and correcting the bits stored in the buffer based on possible detected errors.

12. The channel decoding method according to claim 11 wherein the first block decoding algorithm comprises a low-density parity code (LDPC) algorithm.

13. The channel decoding method according to claim 11 wherein the second block decoding algorithm comprises a Bose/Ray-Chaudhuri/Hocquenghem (BCH) algorithm.

14. The channel decoding method according to claim 11 wherein the second block decoding algorithm comprises a Reed-Solomon algorithm.

15. The channel decoding method according to claim 11 wherein correcting the bits comprises parallel processing the bits of each second subset of bits received.

* * * * *